(12) United States Patent
Rivnay et al.

(10) Patent No.: US 12,389,561 B1
(45) Date of Patent: Aug. 12, 2025

(54) COMPUTE AND/OR STORAGE RACK-WALL

(71) Applicant: Amazon Technologies, Inc., Seattle, WA (US)

(72) Inventors: Roey Rivnay, Sammamish, WA (US); Joel Crain, Renton, WA (US); William Mark Megarity, Renton, WA (US); Timothy Allan Pizzino, Seattle, WA (US); Noah Thomas Kelly, Cascade, CO (US); Andrew Charles Crain, Everett, WA (US)

(73) Assignee: Amazon Technologies, Inc., Seattle, WA (US)

( * ) Notice: Subject to any disclaimer, the term of this patent is extended or adjusted under 35 U.S.C. 154(b) by 36 days.

(21) Appl. No.: 18/477,321

(22) Filed: Sep. 28, 2023

(51) Int. Cl.
| | |
|---|---|
| G06F 1/16 | (2006.01) |
| H05K 5/00 | (2025.01) |
| H05K 7/00 | (2006.01) |
| H05K 7/14 | (2006.01) |

(52) U.S. Cl.
CPC ......... H05K 7/1489 (2013.01); H05K 7/1418 (2013.01)

(58) Field of Classification Search
CPC .. H05K 7/1418; H05K 7/1489; H05K 7/1492; H05K 7/1494; H05K 7/1495; H05K 7/1488; H05K 7/1487; H05K 7/1485
See application file for complete search history.

(56) References Cited

U.S. PATENT DOCUMENTS

| | | | |
|---|---|---|---|
| 5,222,897 | A | 6/1993 | Collins |
| 6,134,113 | A | 10/2000 | Mills et al. |
| 6,285,545 | B1 | 9/2001 | Lopez |
| 6,487,071 | B1 | 11/2002 | Tata et al. |
| 6,618,254 | B2 | 9/2003 | Ives |
| 6,654,241 | B2 | 11/2003 | Hillyard |
| 6,804,877 | B2 | 10/2004 | Mueller et al. |
| 7,394,660 | B2 * | 7/2008 | Hidaka ............... H05K 7/1489 |
| 7,656,671 | B2 | 2/2010 | Liu |
| 7,685,613 | B2 | 3/2010 | Permut et al. |
| 7,701,704 | B2 | 4/2010 | Huang et al. |

(Continued)

FOREIGN PATENT DOCUMENTS

| | | |
|---|---|---|
| CN | 201527602 | 7/2010 |
| CN | 101866198 | 10/2010 |

(Continued)

*Primary Examiner* — Anthony M Haughton
(74) *Attorney, Agent, or Firm* — Alexander A. Knapp; Kowert, Hood, Munyon, Rankin & Goetzel, P.C.

(57) ABSTRACT

A rack-wall computing and/or data storage system includes computing and/or storage devices mounted in enclosures; the enclosures are also mounted in one or more device chassis that fit into one or more vertical slots of an open-faced mounting structure. The mounting structure is free of vertical or horizontal supports on a front side, which allows for a greater density of enclosures (and therefore computing or storage devices) to be mounted in a given volume of space, as compared to conventional racks that include vertical supports at repeating intervals (e.g., every 24 inches). Also, a given device chassis can be extracted from the mounting structure, via the open front face, using a rail system, wherein in the extracted position, the enclosures are accessible for servicing on at least two sides (e.g., front and back).

20 Claims, 16 Drawing Sheets

(56) References Cited

U.S. PATENT DOCUMENTS

| | | | |
|---|---|---|---|
| 7,916,465 B2 * | 3/2011 | Chen | G06F 1/187 |
| | | | 361/679.33 |
| 8,508,930 B2 | 8/2013 | Peng et al. | |
| 8,902,579 B1 | 12/2014 | Lalouette | |
| 8,995,136 B2 * | 3/2015 | Kostecka | H05K 7/1489 |
| | | | 361/679.37 |
| 9,176,915 B2 | 11/2015 | Fu | |
| 9,198,310 B2 | 11/2015 | Eichelberg et al. | |
| 9,247,667 B2 * | 1/2016 | Sato | H05K 7/1421 |
| 9,253,920 B2 * | 2/2016 | Rossi | H05K 7/20254 |
| 9,317,078 B2 | 4/2016 | Lam | |
| 9,320,169 B2 | 4/2016 | Adrian | |
| 9,351,424 B2 * | 5/2016 | Facusse | H05K 7/20809 |
| 9,363,926 B1 | 6/2016 | Bryan | |
| 9,380,727 B2 * | 6/2016 | Bailey | B65B 13/02 |
| 9,537,291 B1 * | 1/2017 | Wilding | H05K 7/20745 |
| 9,622,373 B1 * | 4/2017 | Sarti | H02M 3/04 |
| 9,832,905 B2 | 11/2017 | Rivnay et al. | |
| 9,867,318 B2 | 1/2018 | Eichelberg et al. | |
| 9,936,611 B1 | 4/2018 | Bryan | |
| 10,244,652 B1 | 3/2019 | Czamara et al. | |
| 1,038,060 A1 | 8/2019 | Bryan | |
| 10,499,553 B2 | 12/2019 | Frink et al. | |
| 10,575,428 B2 | 2/2020 | Rivnay et al. | |
| 10,667,425 B1 | 5/2020 | Gardner et al. | |
| 11,395,433 B2 | 7/2022 | Frink et al. | |
| 11,467,636 B1 | 10/2022 | Rivnay et al. | |
| 2001/0049210 A1 | 12/2001 | Pinteric | |
| 2005/0219826 A1 | 10/2005 | Carlson | |
| 2006/0132964 A1 | 6/2006 | Lau | |
| 2006/0134997 A1 | 6/2006 | Curtis | |
| 2010/0118483 A1 | 5/2010 | Kurokawa | |
| 2011/0007464 A1 | 1/2011 | Leigh | |
| 2011/0289327 A1 | 11/2011 | Nolterieke | |
| 2012/0116590 A1 | 5/2012 | Florez-Larrahondo et al. | |
| 2013/0155604 A1 | 6/2013 | Lin | |
| 2015/0181748 A1 | 6/2015 | Bailey et al. | |
| 2016/0095246 A1 | 3/2016 | Noland | |
| 2016/0103472 A1 | 4/2016 | Schuette | |
| 2016/0194863 A1 | 7/2016 | Schmitt | |
| 2016/0194893 A1 | 7/2016 | Schmitt | |
| 2016/0205804 A1 | 7/2016 | Hartman | |
| 2016/0291645 A1 | 10/2016 | Alvarado | |
| 2017/0303439 A1 | 10/2017 | Cader | |
| 2023/0066170 A1 | 3/2023 | Rivnay et al. | |

FOREIGN PATENT DOCUMENTS

| CN | 101960677 | 1/2011 |
|---|---|---|
| CN | 102469740 | 5/2012 |

* cited by examiner

COMPUTE AND/OR STORAGE RACK-WALL

BACKGROUND

Computer systems typically include a number of components, including printed circuit boards, mass storage devices, power supplies, and processors. Some known computer systems are configured into rack-mountable components and are positioned within a rack system. Some known rack systems are configured to support 40 such rack-mounted components. Such rack systems typically include horizontal shelves supported by vertical posts, which are spaced at repeating intervals, such as every 24 inches. The rack-mountable computer systems fit within the horizontal shelves and are supported in the rack by the vertical posts included at the repeating intervals (e.g., every 24 inches). Moreover, typical data centers include a plurality of such rack systems.

Some computer systems include a number of hard disk drives or other storage devices (for example, eight or more hard disk drives) to provide adequate data storage. Typically, the hard disk drives for servers are of a standard, off-the-shelf type. Standard, off-the-shelf hard disk drives are often a cost-effective solution for storage needs because such hard disk drives can be obtained at relatively low cost. Nonetheless, in server designs using such standard hard disk drives, the arrangement of the hard disk drives may leave a substantial amount of wasted space. This wasted space, especially when multiplied over many servers in a rack, and many racks in a data center, may result in inadequate computing or storage capacity.

Figure 1:
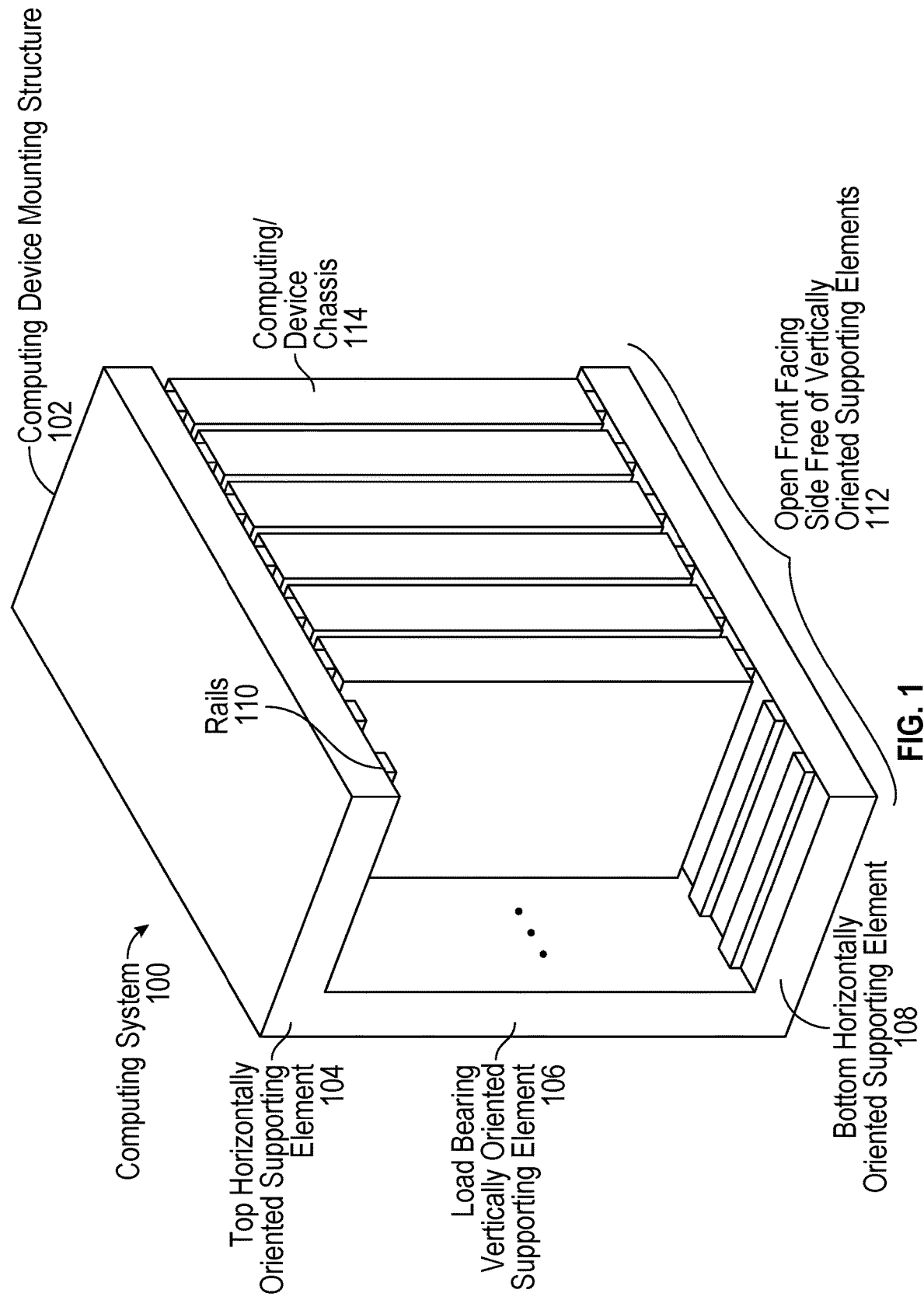
FIG. 1 is a perspective view illustrating a rack-wall computing and/or data storage system, wherein the rack-wall computing and/or data storage system comprises a top horizontal structural element, a bottom horizontal structural element, and a vertical structural element that form a mounting structure having an open front face, free of vertical supporting elements, which allows for a greater density of computing or storage devices than conventional rack systems having vertical posts at repeating intervals, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of rack-wall computing and/or data storage systems and methods for performing computing operations and data storage operations using rack-wall computing and/or data storage systems, are disclosed. According to some embodiments, a rack-wall computing and/or data storage system includes an open-faced mounting structure free of vertical supports on a front side. Also, computing and/or data storage device chassis are mounted in the open-faced mounting structure, vertically, in respective slots of the open-faced mounting structure. Each chassis includes a plurality of enclosures, wherein the contents of a given enclosure form a respective storage server or a respective computing server. For example, an enclosure may include a set of mass storage devices and respective controller cards that form a storage server; or memory devices and processors that form a respective computing server. In some embodiments, a computing server may include various types of specialized (or general purpose) processors, such as various types of accelerators (graphics processing units (GPUs), artificial intelligence (AI) processors, networking accelerators, etc.). The open-faced mounting structure includes top and bottom horizontally-oriented supporting elements with rails mounted to the supporting elements, wherein the rails are configured to engage with rail carriages of the computing and/or storage device chassis (within which the sets of enclosures are mounted). The open-faced mounting structure further includes a vertically-oriented supporting element at the rear of the mounting structure which supports the weight of the top horizontally-oriented supporting element and further provides rigidity for the overall mounting structure and the computing and/or storage device chassis, when mounted in the mounting structure. In some embodiments, the top horizontally-oriented structural element is coupled to the vertically-oriented supporting element in a cantilevered arrangement, or may be supported by extending, overhead over a cold aisle, to a corresponding mounting structure of an adjacent rack-wall computing and/or data storage system.

The above approach allows for the relaxation of enclosure volume boundaries imposed by using standard racks, such as EIA 24" racks (e.g., an Electrical Industries Alliance standard rack). Also, by eliminating vertical support structures from the front side of the rack-wall mounting structure, a greater density of devices, such as mass storage devices, can be included in the mounting structure as compared to conventional racks, such as EIA racks, as an example. Note that a typical rack includes front facing and rear facing vertical support elements that occupy ~ 3 inches of the front and rear face of the rack. However, the disclosed rack-wall mounting structure eliminates such front facing support elements, which frees up additional space (e.g., 3" per conventional rack width) to be used to house computing and/or storage devices. For example, a typical rack row in a data center includes approximately 30-40 racks. By using a rack-wall mounting structure, as disclosed herein, instead of conventional 24" racks, approximately 7.5-10 feet of mounting structure length along the cold aisle is freed up to house additional computing and/or storage devices. Also, this arrangement allows for greater space to be provided between computing and/or storage devices, such as gaps between adjacent mass storage devices. This additional space reduces air flow restrictions and allows for fans used to cool the computing and/or storage devices to operate at lower speeds. For example, a set of fans may be reduced from operating at 14,700 RPMs to lower than 10,000 RPMs (e.g., 7,250 RPMs) by increasing the gap between adjacent mass storage devices. This may be achieved in a same volume of space in a data center as previously occupied by a set of conventional racks. This may improve other operational aspects, such as reducing vibrations, such as RVI (rotational vibration interference). In some embodiments, the space savings by eliminating front facing vertical supports may be used solely to increase density or may be used to both increase density (to a slightly lesser degree) and also reduce air flow restrictions by increasing gaps spaces between components, such as mass storage devices.

Also, in some embodiments, the computing and/or storage device chassis (hosting the respective enclosures) may be rail mounted and may be hot-serviceable on two sides. For example, a technician may be able to pull a given computing and/or storage device chassis out of the mounting structure (while still connected to power) and service individual enclosures from both sides. In some embodiments, enclosures may include controller cards on a first side and openings for accessing mass storage devices (such as hard disk drives HDDs or solid-state drives (SSDs)) on a second side. In this way, once extracted the controller cards may be serviced from one side while the mass storage devices may be serviced from the other side. Also, greater density is achieved as compared to other hot-serviceable designs by using rails and rail carriages to move a whole computing and/or storage chassis (as opposed to including rails on each individual enclosure).

Additionally, in some embodiments, size and form factor flexibility may be extended by using more than one vertical slot to house a computing and/or storage device chassis. For example, in some embodiments, a given chassis may have a width greater than one vertical slot and may occupy two or more adjacent vertical slots. This may further allow for improved density by eliminating a volume/size constraint horizontally in addition to the vertical constraint flexibility already realized by removing supporting elements from the front face.

As used herein, "backplane" means a plate or board to which other electronic components, such as interposer cards and mass storage devices, etc. can be mounted. In some embodiments, mass storage devices, which can include one or more hard disk drives, are plugged into a backplane in a generally perpendicular orientation relative to the face of the backplane. In some embodiments, a virtualization offloading card is plugged into a backplane. In some embodiments, a backplane includes one or more power buses that can transmit power to components on the backplane, and one or more data buses that can transmit data to and from components installed on the backplane. Also, in some embodiments a backplane may include an application specific integrated circuit (ASIC) configured to provide Ethernet switching for components mounted on the backplane.

As used herein, a "cable" includes any cable, conduit, or line that carries one or more conductors and that is flexible over at least a portion of its length. A cable may include a connector portion, such as a plug, at one or more of its ends.

As used herein, "circuit board" means any board or plate that has one or more electrical conductors transmitting power, data, or signals from components on or coupled to the circuit board to other components on the board or to external components. In certain embodiments, a circuit board is an epoxy glass board with one or more conductive layers therein. A circuit board may, however, be made of any suitable combination of materials.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, fans, cables, and other components of the computer system.

As used herein, "computing" includes any operations that can be performed by a computer, such as computation, data storage, data retrieval, or communications.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, "mounting" a particular element on another element refers to positioning the particular element to be in physical contact with the other element, such that the other element provides one or more of structural support, positioning, structural load transfer, stabilization, shock absorption, some combination thereof, or the like with regard to the particular element. The mounted particular element may be positioned to rest upon one or more upper surfaces of the other element, independent of coupling the elements via one or more coupling elements. In some embodiments, mounting the particular element to another element includes coupling the elements such that the other element provides one or more of structural support, positioning, structural load transfer, stabilization, shock absorption, some combination thereof, or the like with regard to the particular element.

As used herein, a "rack" means a rack, container, frame, or other element or combination of elements that can contain or physically support one or more computer systems. In some embodiments a rack is a standard 19" or 24" rack that conforms to EIA standards.

FIG. 1 is a perspective view illustrating a rack-wall computing and/or data storage system, the rack-wall computing and/or data storage system comprises a top horizontal structural element, a bottom horizontal structural element, and a vertical structural element that form a mounting structure having an open front face, free of vertical supporting elements, which allows for a greater density of computing or storage devices than conventional rack systems having vertical posts at repeating intervals, according to some embodiments.

Figure 5:
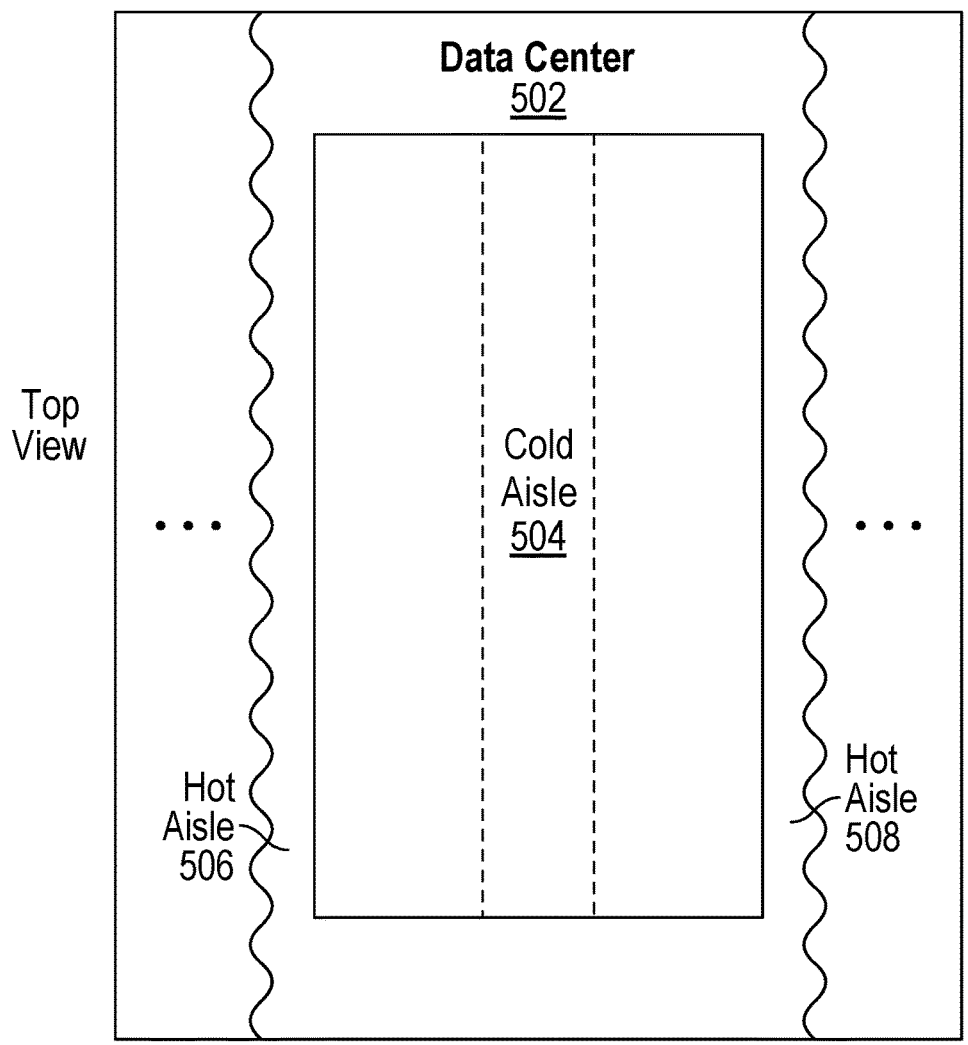
FIG. 5 illustrates a top view and a front view of a data center comprising a connected set of rack-wall computing and/or data storage systems positioned on either side of a cold aisle, with hot aisles at the rears of the respective rack-wall computing and/or data storage systems, wherein the rack-wall computing and/or data storage systems share a top vertical structural element that spans, overhead, across the cold aisle, according to some embodiments.
Figure 5:
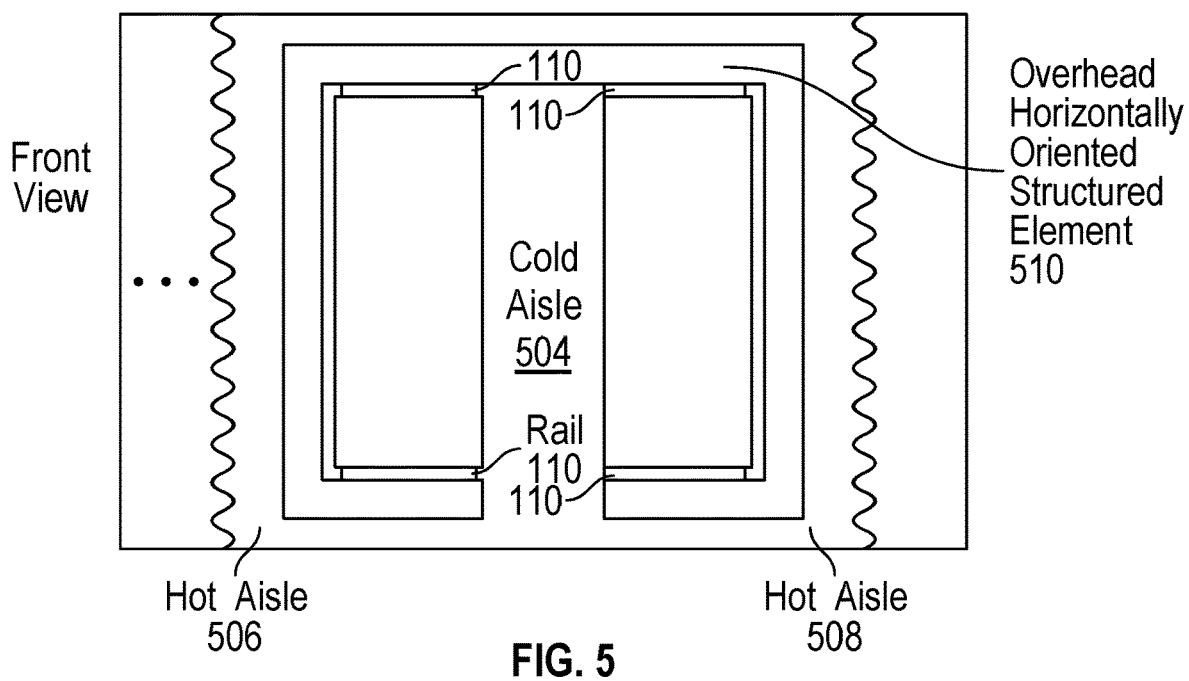
Figure 14:
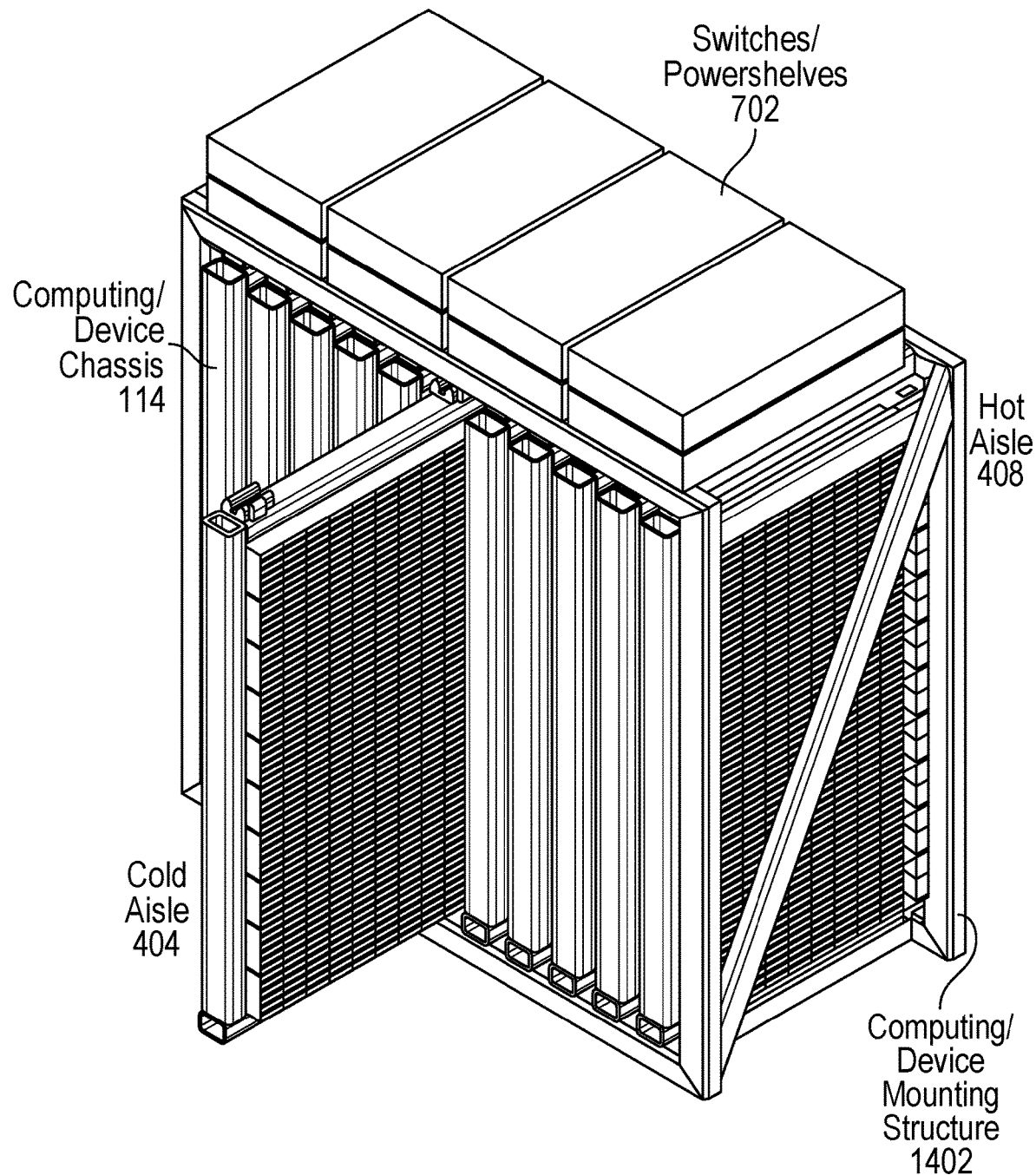
FIG. 14 is a perspective view providing a more detailed representation of an example rack-wall computing and/or data storage system, according to some embodiments.
Figure 15:
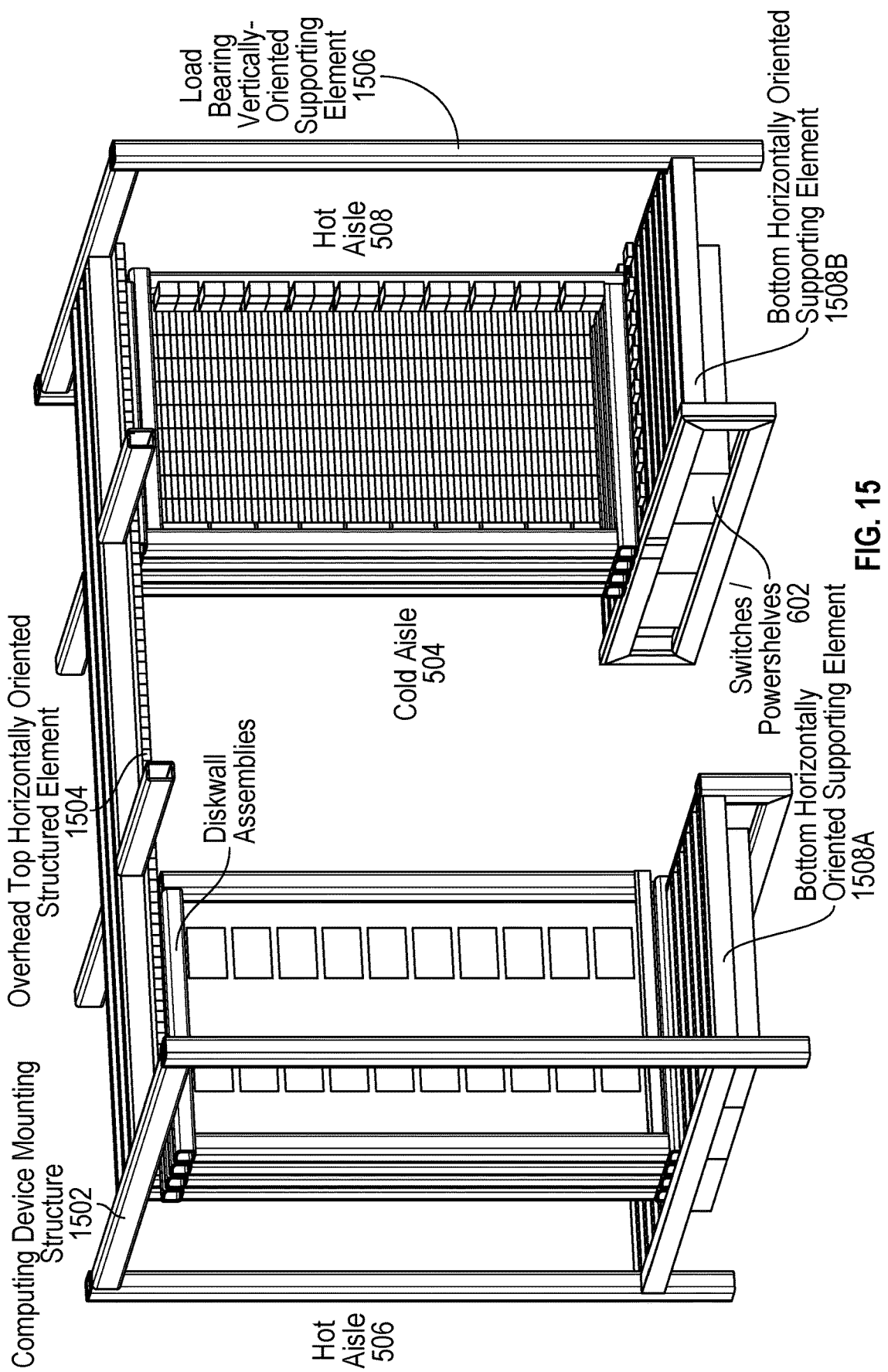
FIG. 15 is a perspective view providing a more detailed representation of an example set of rack-wall computing and/or data storage systems, according to some embodiments.

In some embodiments, a rack-wall computing and/or data storage system, such as rack-wall computing and/or data storage system 100, includes a top horizontally-oriented supporting element 104, a bottom horizontally-oriented supporting element 108, and a vertically-oriented supporting element 106. In some embodiments, the supporting elements 104, 106, and 108 may be made out of structural materials, such as steel, or other metals or polymers. In some embodiments, the structural elements 104, 106, and 108 may be solid (as shown in FIG. 1) or may be formed from structural elements with spaces in between the structural elements such as beams, tubes, braces, etc. For example, FIGS. 14 and 15 illustrate more detailed example configurations. In some embodiments, top horizontally-oriented supporting element 104 may be supported by vertically-oriented supporting element 106 without the need for additional structural supports at the open front facing side 112 of the mounting structure 102. Also, in some embodiments, top horizontally-oriented supporting element 104 may be supported, at least in part, by an adjacent mounting structure, such as is shown in FIGS. 5 and 15. The mounting structure 102 may span a full length of an aisle in a data center. For example, instead of arranging 30-40 individual racks in a row in a data center on a given side of an aisle, which is a common practice, a single mounting structure 102 may span an equivalent length of the aisle but may avoid the need for vertical support elements being interspersed, at the front facing side 112, along the length of the aisle.

Figure 16:
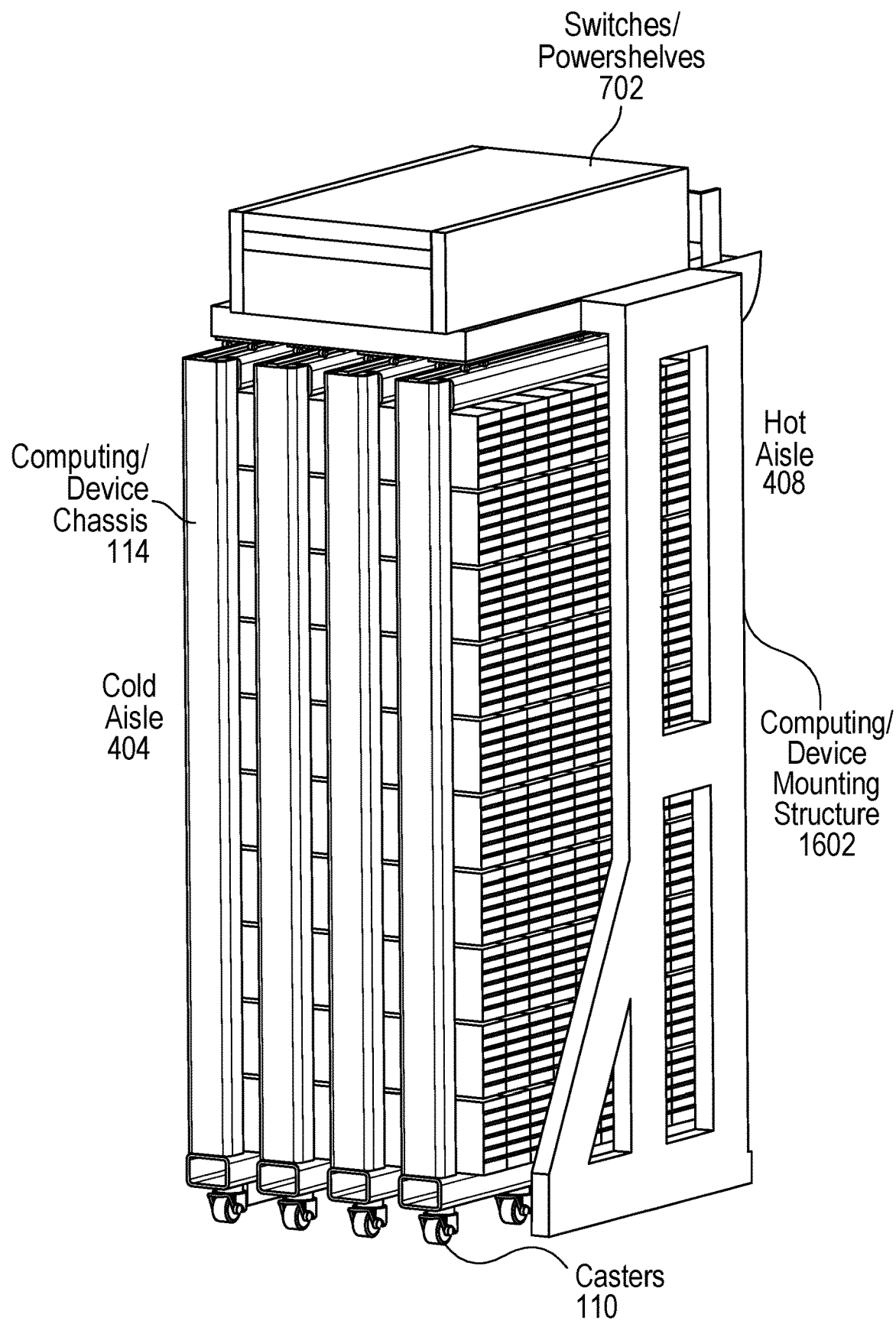
FIG. 16 is a perspective view providing a more detailed representation of another example rack-wall computing and/or data storage system, according to some embodiments.

Additionally, the rack-wall computing and/or data storage system 100 includes computing and/or storage device chassis(s) 114 mounted in the mounting structure 102 via rails 110. In some embodiments, rails 110 may be mounted to the top horizontally-oriented supporting element 104, the bottom horizontally-oriented supporting element 108, or both. In some embodiments, casters may be used, for example instead of having rails on both the top and bottom of computing and/or storage device chassis(s) 114, casters may be used on the bottom, such as shown in FIG. 16.

Figure 8:
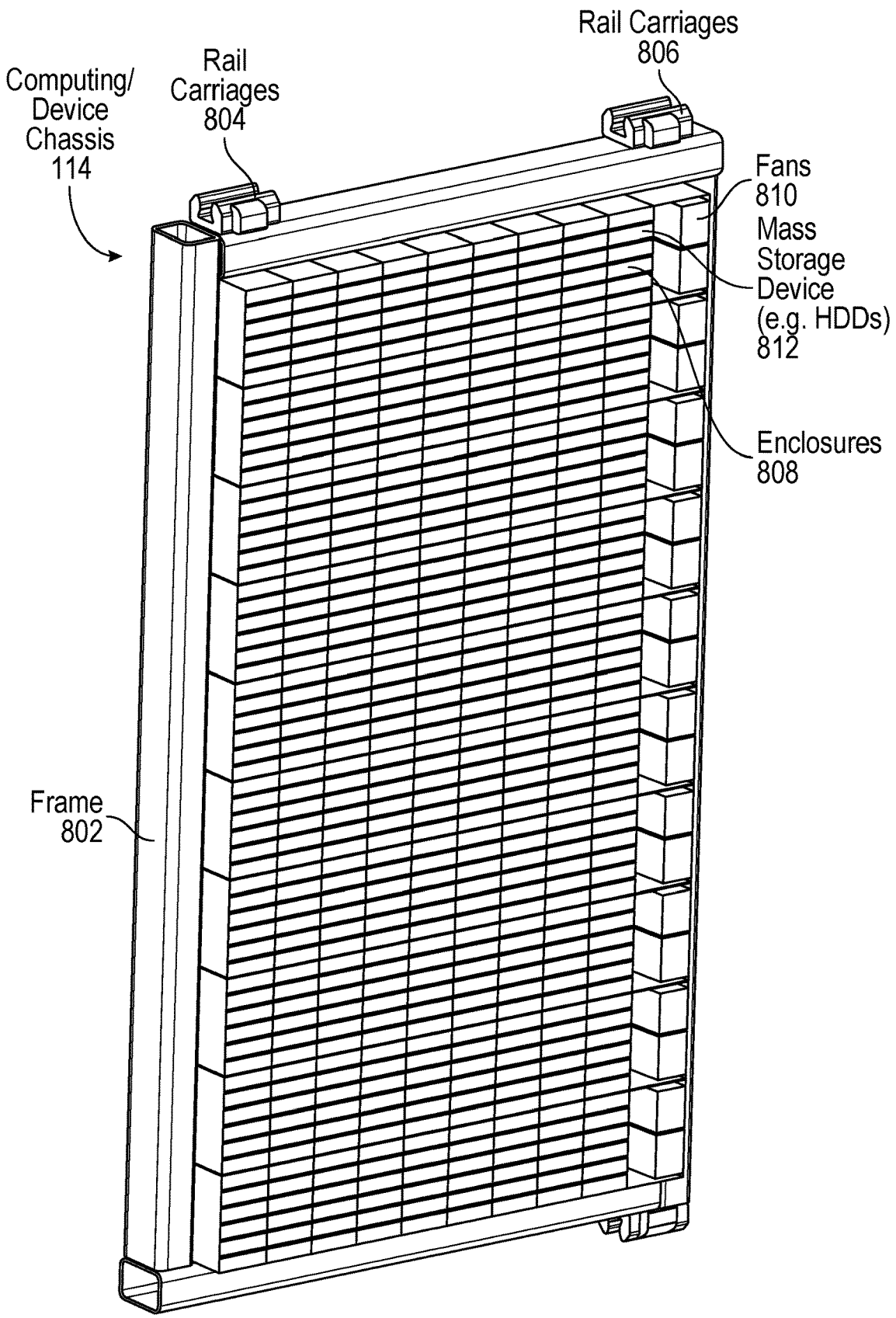
FIG. 8 is a perspective view of a computing and/or storage device chassis that mounts in an interior of a mounting structure of a rack-wall computing and/or data storage system, according to some embodiments.
Figure 9:
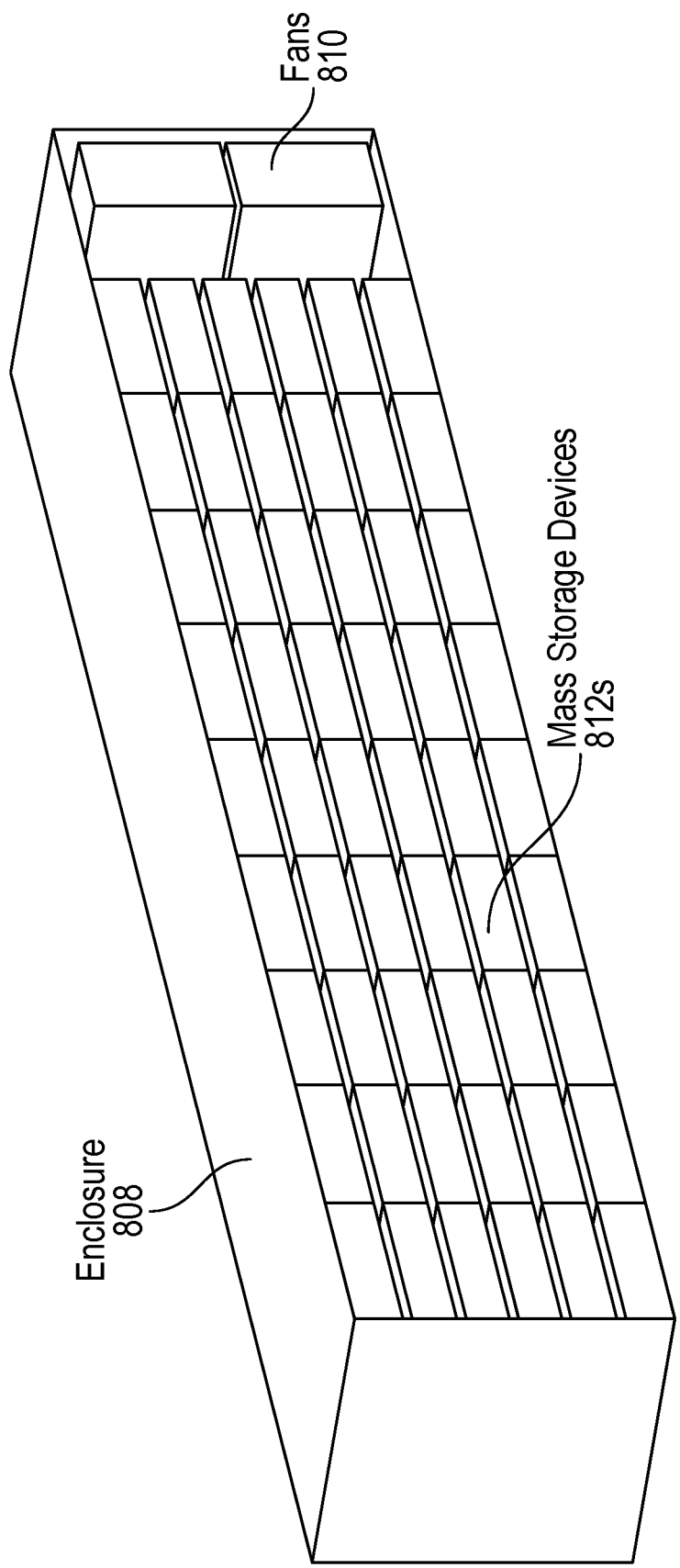
FIG. 9 is a perspective view of an enclosure that mounts (with other enclosures) in a computing and/or storage device chassis, wherein the enclosure comprises multiple mass storage devices and controllers, according to some embodiments.

Each of the computing and/or storage device chassis(s) 114 may include a set of enclosures, such as shown in FIG. 8, wherein each of the enclosures includes mass storage devices and controllers (or other computing devices), such as shown in FIG. 9.

Figure 2:
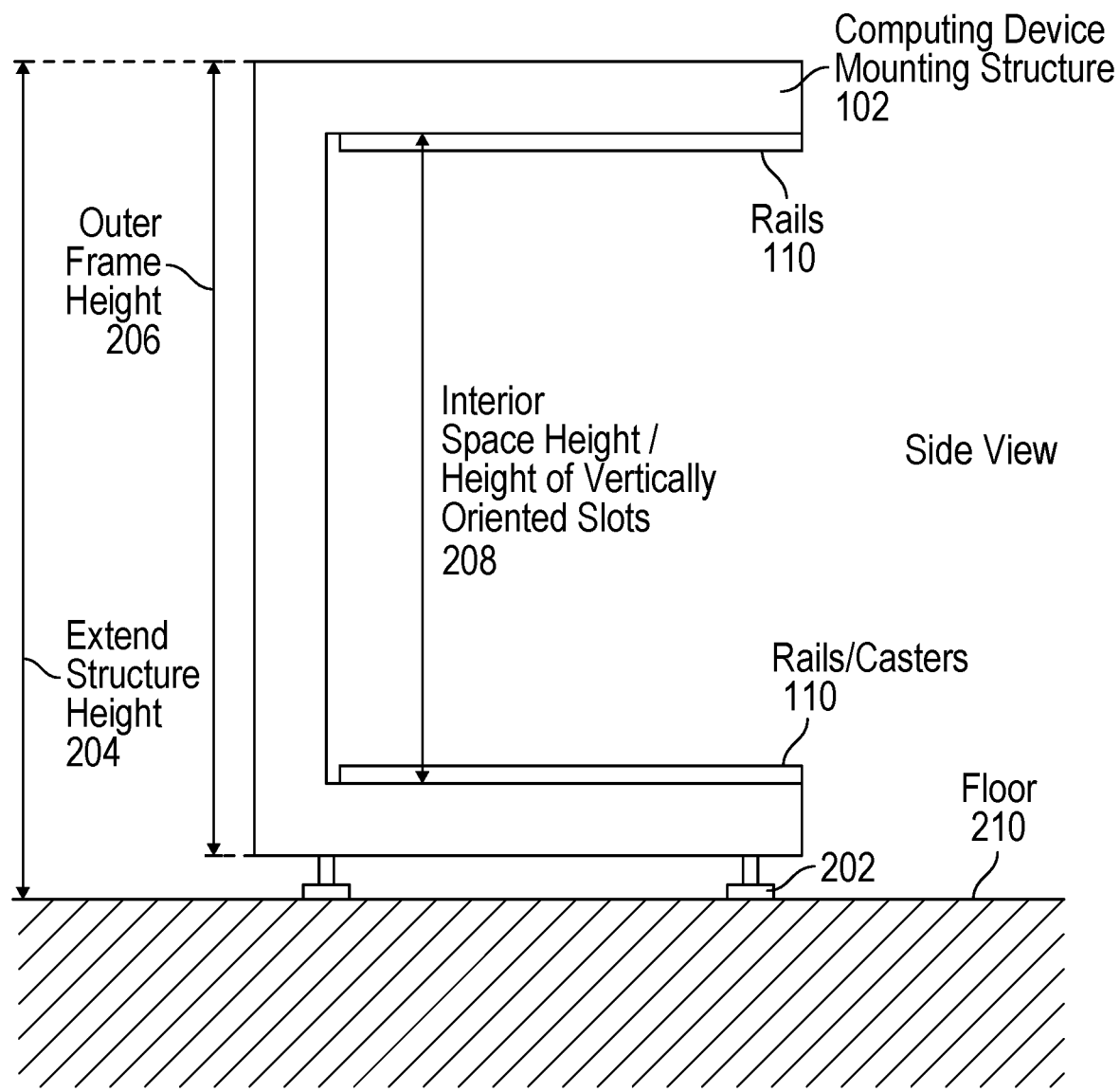
FIG. 2 is a side view of a rack-wall computing and/or data storage system mounting structure, illustrating an interior space free of vertical supporting elements, according to some embodiments.

FIG. 2 is a side view of a rack-wall computing and/or data storage system mounting structure, illustrating an interior space free of vertical supporting elements, according to some embodiments.

As can be seen in FIG. 2, the interior space 208 is free of vertical (or horizontal supports) at the front of the mounting structure 102 and throughout the interior space of the mounting structure, other than the rear vertical support 106. Also, the mounting structure 102 has an overall structure height 204 that includes outer frame height 206 and an additional amount of height added by the legs 202. As can be seen, the mounting structure 102 is configured to mount on floor 210, such as a floor of a data center hall of a data center. In some embodiments, the outer frame height and/or the overall structure height may exceed 5 feet or more. In some embodiments, the mounting structure 102 may be self-standing or may be anchored into floor 210 (not shown).

Figure 3:
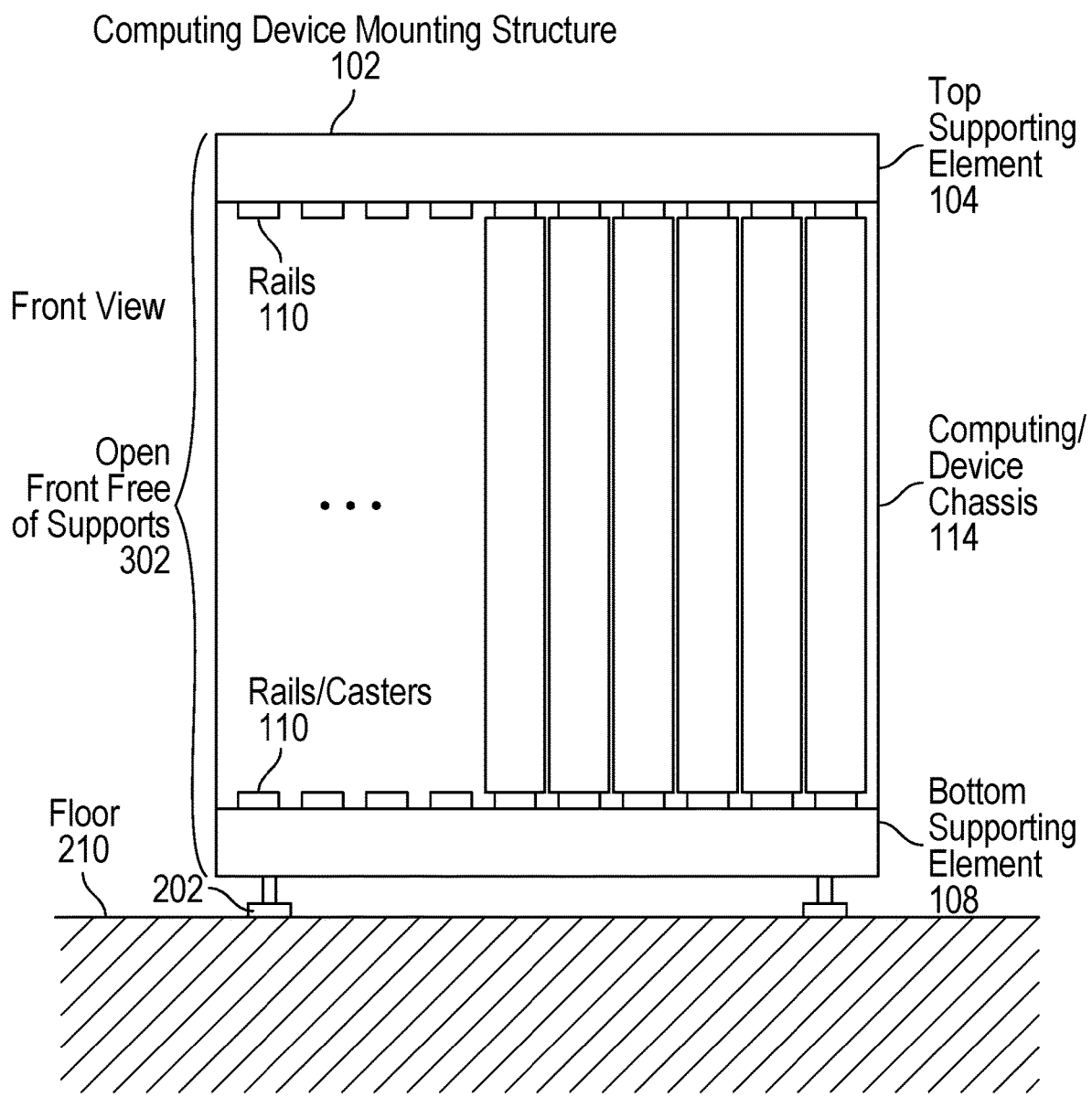
FIG. 3 is a front view of a rack-wall computing and/or data storage system mounting structure, illustrating computing and/or storage device chassis installed in the mounting structure in vertical slots, according to some embodiments.

FIG. 3 is a front view of a rack-wall computing and/or data storage system mounting structure, illustrating computing and/or storage device chassis installed in the mounting structure in vertical slots, according to some embodiments.

As can be seen in FIG. 3, the front 302 of the mounting structure 102 is open and free of supports, which allows for a greater density of computing and/or storage device chassis(s) 114 to be mounted in the mounting structure. For example, it is not necessary to leave space for vertical support beams, such as are included every 24" when arranging conventional racks into a row.

Figure 4:
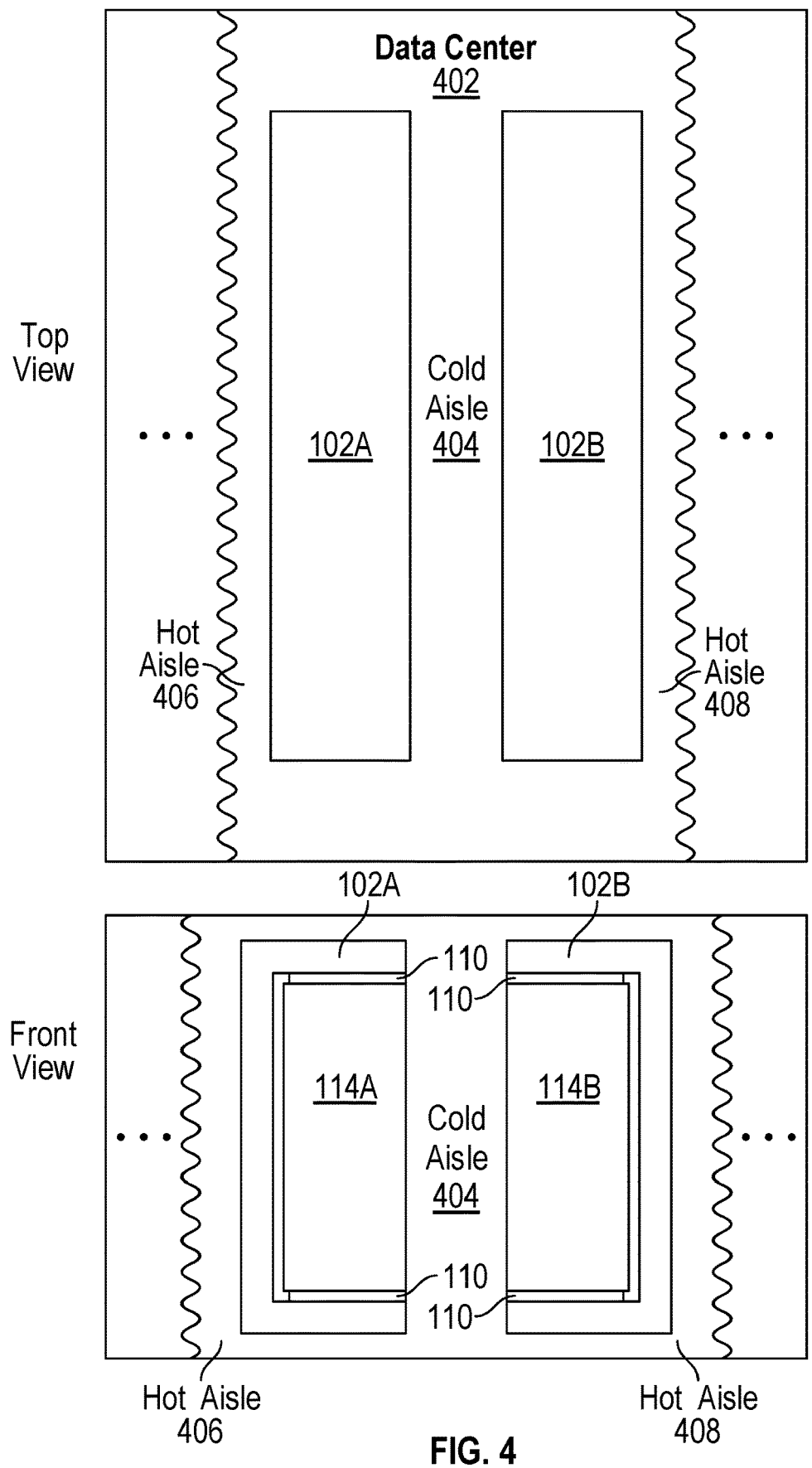
FIG. 4 illustrates a top view and a front view of a data center comprising a set of rack-wall computing and/or data storage systems positioned on either side of a cold aisle, with hot aisles at the rears of the respective rack-wall computing and/or data storage systems, according to some embodiments.

FIG. 4 illustrates a top view and a front view of a data center comprising a set of rack-wall computing and/or data storage systems positioned on either side of a cold aisle, with hot aisles at the rears of the respective rack-wall computing and/or data storage systems, according to some embodiments.

In some embodiments, rack-wall mounting structures, such as shown in FIGS. 1-3 may be included in a data center, for example as an alternative to using rows of conventional racks. For example, FIG. 4 illustrates data center 402 that includes rack-wall mounting structures 102A and 102B on either side of cold aisle 404. Also, hot aisles 406 and 408 abut the rear side of the rack-wall mounting structures 102A and 102B. For example, the fans of the enclosures included in the computing and/or storage device chassis 114 of the rack-wall mounting structures 102A and 102B may exhaust air into the hot aisles 406 and 408. Also, these fans may cause cold air to be drawn into the enclosures via the front faces of the mounting structures 102A and 102B, which face cold aisle 404.

Figures 10A, 10B:
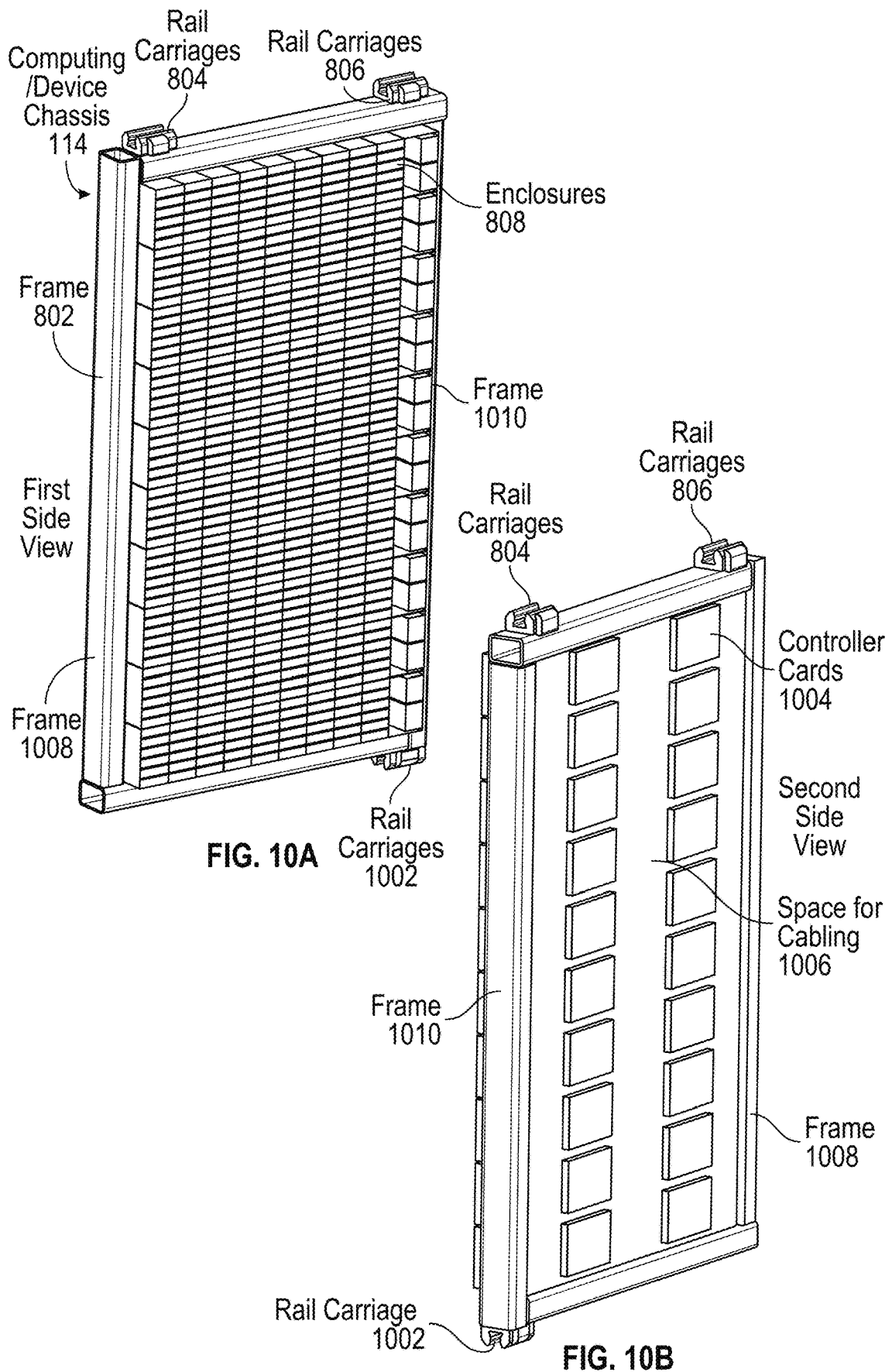
FIGS. 10A and 10B are perspective views illustrating a first side and a second side of the computing and/or storage device chassis that has been loaded with a plurality of enclosures, according to some embodiments.

In some situations, in order to perform maintenance, individual ones of the computing and/or storage device chassis 114A or 114B may be partially extracted out of a respective one of the rack-wall mounting structures 102A or 102B, and positioned in a portion of cold aisle 404 to enable a technician to access the enclosures included in the computing and/or storage device chassis 114. For example, FIGS. 10A and 10B illustrate a first and second side of a computing and/or storage device chassis 114 that are accessible when partially extracted into the cold aisle 404.

FIG. 5 illustrates a top view and a front view of a data center comprising a connected set of rack-wall computing and/or data storage systems positioned on either side of a cold aisle, with hot aisles at the rears of the respective rack-wall computing and/or data storage systems, wherein the rack-wall computing and/or data storage systems share a top vertical structural element that spans, overhead, across the cold aisle, according to some embodiments.

The arrangement in FIG. 5 is similar to that of FIG. 4, however in some embodiments, an overhead horizontally oriented top structural element 510 may span a width of cold aisle 504 and connect between the respective mounting structures 102A and 102B. In some embodiments, the top horizontally-oriented supporting element 104 of both mounting structures 102A and 102B may be a single shared supporting element that spans the cold aisle 504. Alternatively, in some embodiments, respective ones of the top horizontally-oriented supporting elements 104 of respective mounting structures 102A and 102B may connect to each other, for example in an overhead location above cold aisle 504.

Figure 6:
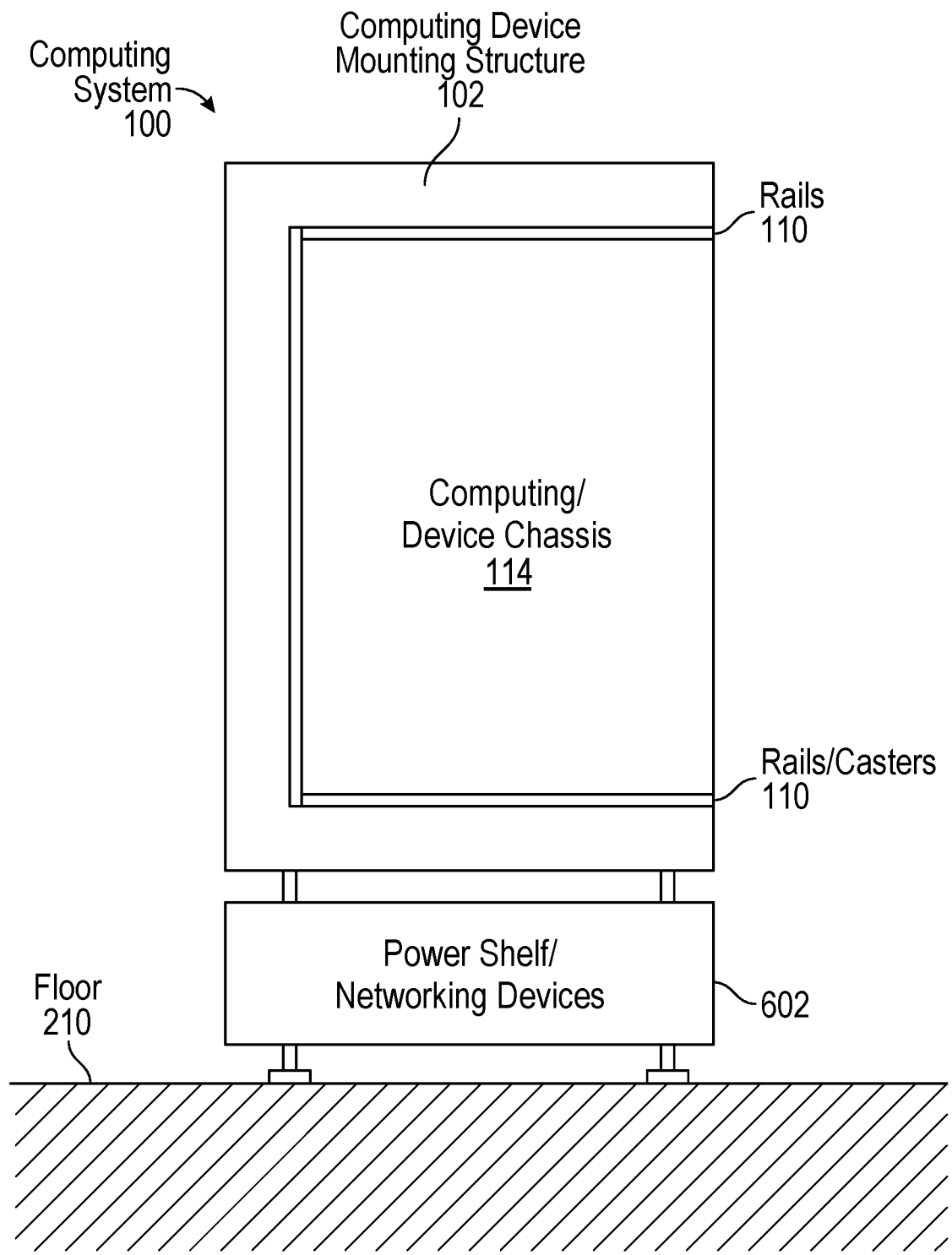
FIG. 6 illustrates a side view of a rack-wall computing and/or data storage system that includes a power shelf and network devices mounted in a space beneath the interior of the computing and/or data storage system mounting structure, according to some embodiments.

FIG. 6 illustrates a side view of a rack-wall computing and/or data storage system that includes a power shelf and network devices mounted in a space beneath the interior of the computing and/or data storage system mounting structure, according to some embodiments.

Figure 7:
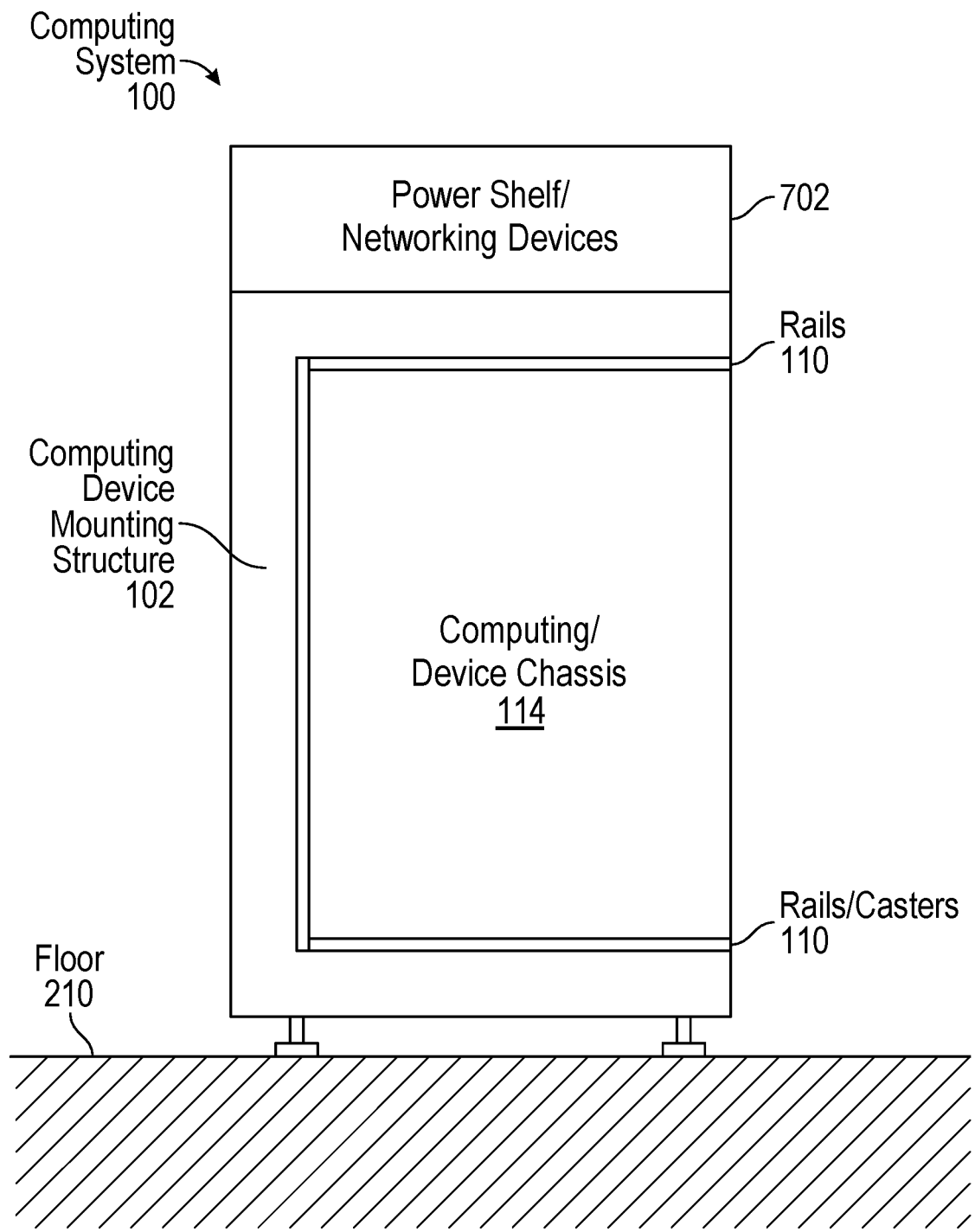
FIG. 7 illustrates a side view of a rack-wall computing and/or data storage system that includes a power shelf and network devices mounted in a space above the interior of the computing and/or data storage system mounting structure, according to some embodiments.

In some embodiments, an additional power shelf and/or networking device container may be included in the rack-wall computing and/or data storage system 100, wherein the power shelf and/or network device, such as 602, mounts below the mounting structure 102, or above the mounting structure. For example, FIG. 7 illustrates a side view of a rack-wall computing and/or data storage system that includes a power shelf and network devices mounted 702 in a space above the interior of the computing and/or data storage system mounting structure, according to some embodiments.

FIG. 8 is a perspective view of a computing and/or storage device chassis that mounts in an interior of a mounting structure of a rack-wall computing and/or data storage system, according to some embodiments.

In some embodiments, the computing and/or storage device chassis(s) 114, as shown in FIGS. 1-7, include frame 802 and rail carriages 804, 806, and 814 configured to slide on rails, such as rails 110. Also, each computing and/or storage device chassis 114 includes multiple enclosures 808, each including mass storage devices 812 and fans 810.

In some embodiments, spacing between the mass storage devices 812 may allow for lower speed fans to be used. For example, fans 810 may spin at 7,250 RPM (as opposed to 14,700 RPM fans used in configurations with less spacing between mass storage devices). Also, as shown in FIG. 10B, each of the enclosures 808 may include one or more controller cards 1004, for example for performing storage operations related to storing (or retrieving) data on the mass storage devices 812.

FIG. 9 is a perspective view of an enclosure that mounts (with other enclosures) in a computing and/or storage device chassis, wherein the enclosure comprises multiple mass storage devices and controllers, according to some embodiments.

For example, enclosure 808 includes rows and columns of mass storage devices 812 arranged within a frame 902 of the enclosure 808. Also, fans 810 are included at a rear of enclosure 808 that is proximate to a rear of the mounting structure 102, when the enclosure 808 is mounted in a computing and/or storage device chassis 114 that is in turn mounted in mounting structure 102.

FIGS. 10A and 10B are perspective views illustrating a first side and a second side of the computing and/or storage device chassis that has been loaded with a plurality of enclosures, according to some embodiments.

Also, as shown in FIGS. 10A and 10B, the computing and/or storage device chassis 114 may include a frame 808 comprising multiple frame elements, such as frame elements 1008 and 1010. Also, as can be seen in FIG. 10B, controller cards 1004 may be mounted on a second side of the enclosures 808, wherein the chassis 114 includes space for cabling 1006 for connections to the controller cards 1004.

Figure 11:
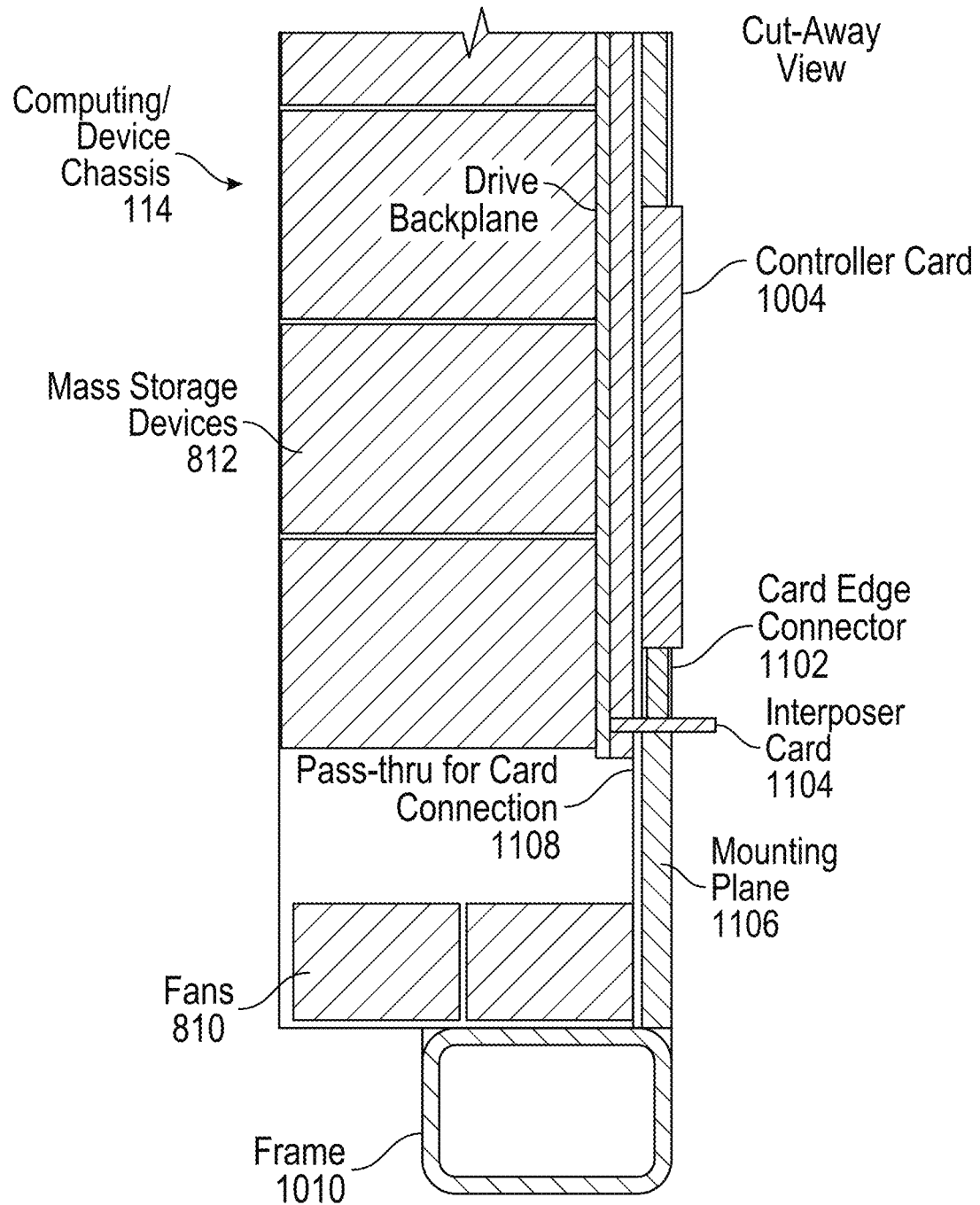
FIG. 11 is a cut-away view illustrating components of an enclosure mounted in a computing and/or storage device chassis, according to some embodiments.

FIG. 11 is a cut-away view illustrating components of an enclosure mounted in a computing and/or storage device chassis, according to some embodiments.

In some embodiments, computing and/or storage device chassis 114 and an enclosure 808 mounted in the computing and/or storage device chassis 114 may have a cross-section as shown in FIG. 11. For example, mass storage devices 812 may plug into backplane 110. Also, backplane 110 may be connected to controller card 1004 via interposer card 1104 and card edge connector 1102. In some embodiments, the mass storage devices 812 may connect to backplane 110 via blind-mate connectors, such that individual ones of the mass storage devices 812 may be removed, or inserted, such as during hot servicing. Also, the controller card 1004 may be easily removable via card edge connector 1102 on a back side of the enclosure 808. Networking connections to the controller card may pass through pass-thru for card connection 1108. For example, networking cables may be routed in this space.

Figure 12:
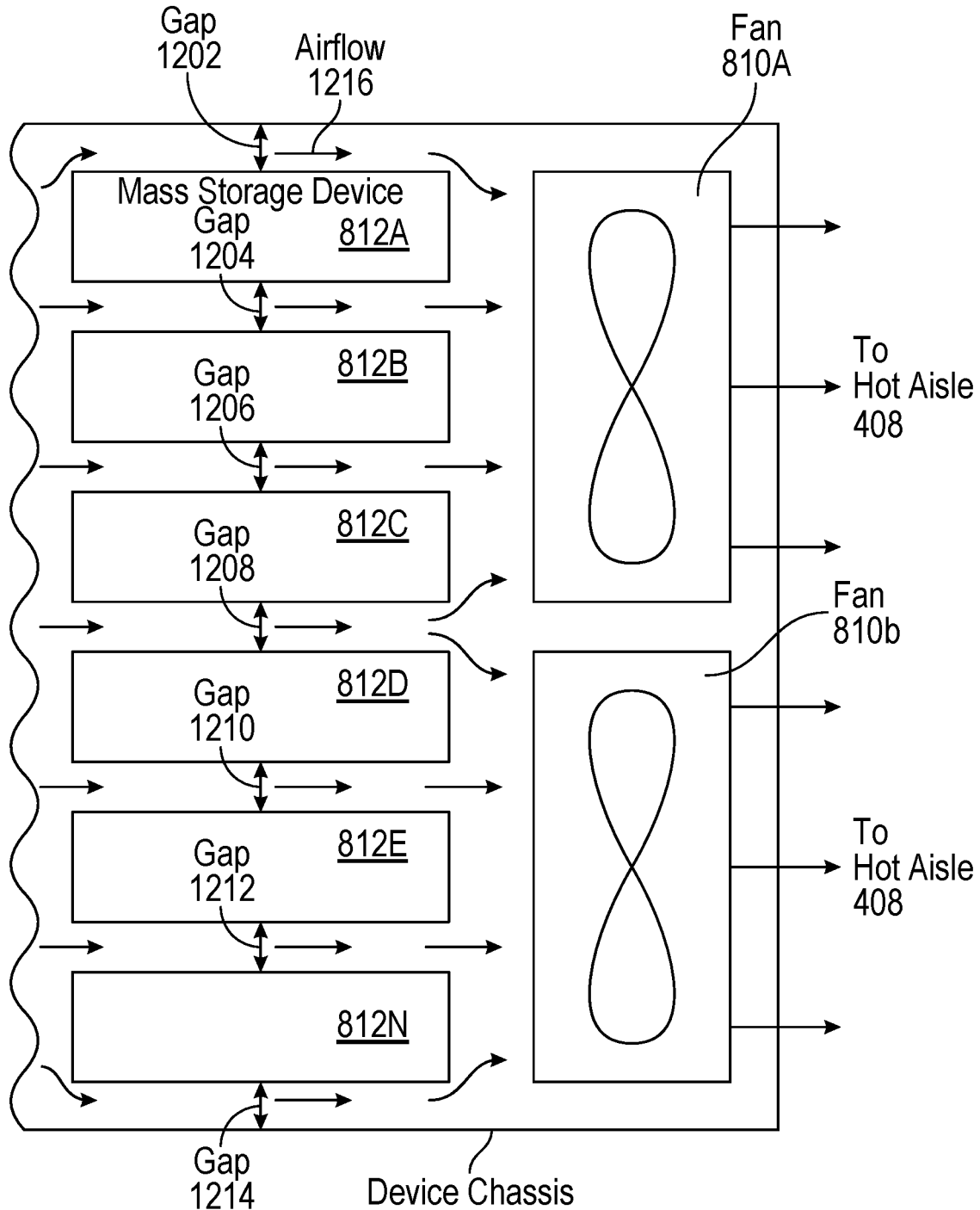
FIG. 12 is a schematic diagram illustrating gap spacing between mass storage devices in an enclosure and also illustrating air flow through the gaps, according to some embodiments.

FIG. 12 is a schematic diagram illustrating gap spacing between mass storage devices in an enclosure and also illustrating air flow through the gaps, according to some embodiments.

In some embodiments, gaps may be provided between respective mass storage devices to allow for better air flow. For example, in FIG. 12, gaps 1202 through 1214 are provided between mass storage devices 812A through 812N. These gaps may facilitate airflow 1216 such that fans 810A and 810B may operate at lower fan speeds, thus saving energy and reducing vibrations.

Figure 13:
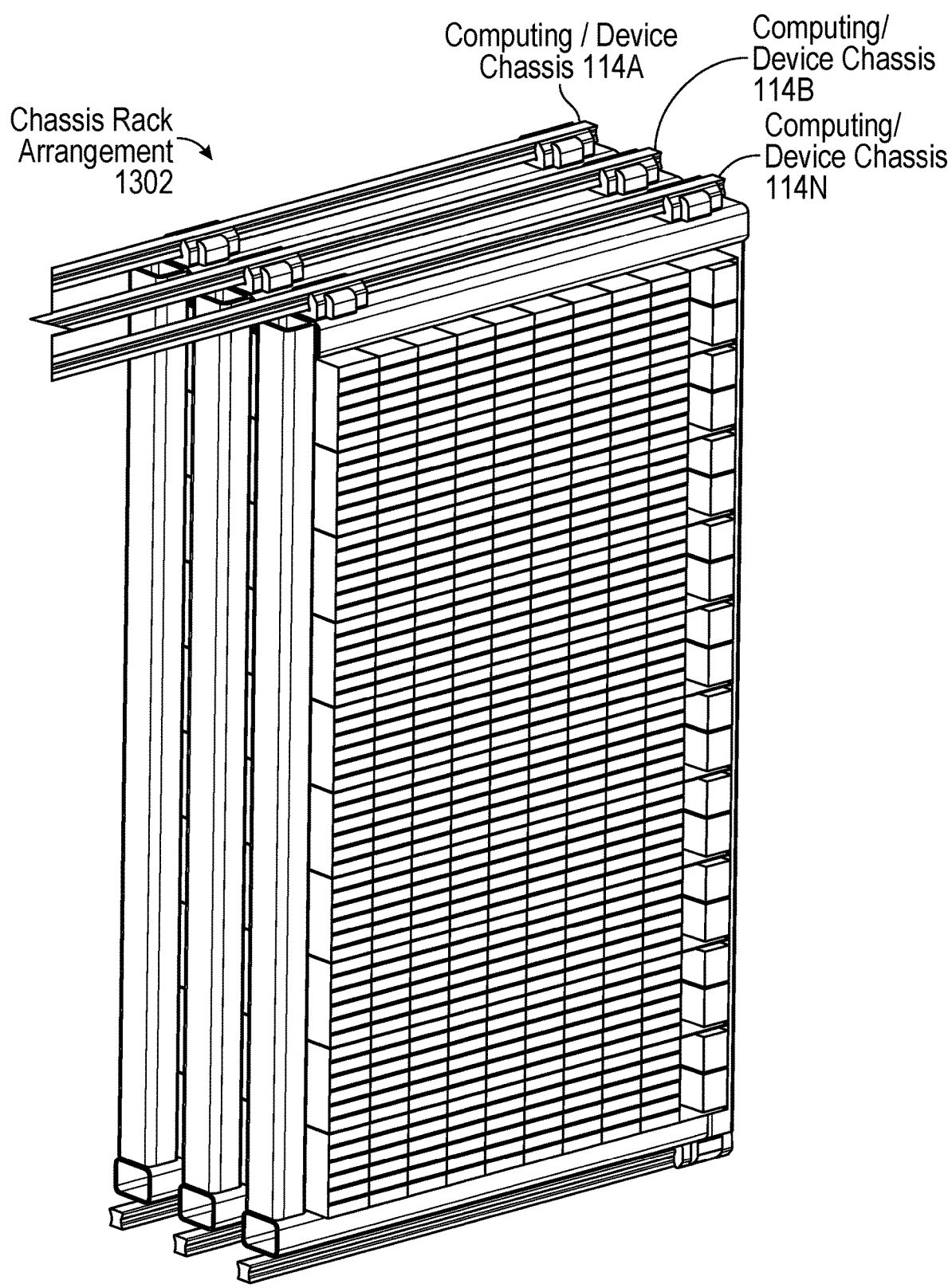
FIG. 13 is a perspective view illustrating a set of adjacently mounted computing and/or storage device chassis, according to some embodiments.

FIG. 13 is a perspective view illustrating a set of adjacently mounted computing and/or storage device chassis, according to some embodiments.

In some embodiments, the computing and/or storage device chassis may be densely arranged next to one another, such as shown for chassis rack arrangement 1302. In some embodiments, any number of computing and/or storage device chassis 114 may be arranged next to each other in a rack-wall mounting structure 102.

FIG. 14 is a perspective view providing a more detailed representation of an example rack-wall computing and/or data storage system 1400 including a computing/device mounting structure 1402, according to some embodiments.

FIG. 15 is a perspective view providing a more detailed representation of an example set of rack-wall computing and/or data storage systems 1500 including a computing/device mounting structure 1502, according to some embodiments.

As can be seen in FIG. 15, in some embodiments, an overhead top horizontally-oriented structural element 1504 may be shared and may span a width of a cold aisle 504. Also, FIG. 15 illustrates example implementations of horizontally and vertically oriented supporting elements, such as vertically-oriented supporting element 1506 and bottom horizontally-oriented supporting elements 1508A and 1508B.

In some embodiments, mass storage devices in a data storage system are standard, off-the-shelf hard disk drives. Examples of suitable hard disk drive form factors may include 3.5", 5.25", and 2.5". In one embodiment, a standard 3.5" hard disk drive is installed in a device slot of a plurality of device slots of an array along with other standard 3.5" hard disk drives.

FIG. 16 is a perspective view providing a more detailed representation of another example rack-wall computing and/or data storage system, according to some embodiments. For example, in some embodiments, a bottom horizontally-oriented structural element may be provided by a floor, such as floor 202. In such embodiments castors 110 may support at least some of the weight of computing/device chassis 114 via the casters 110. In some embodiments, computing device/mounting structure 1602 may have a width similar to a conventional rack, but may be completely free from vertically-oriented supporting elements on a front face of the structure 1602.

The various methods as illustrated in the figures and described herein represent example embodiments of methods. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
    a plurality of rows of computing or storage devices, wherein the computing or storage devices of at least one of the rows are mounted in a mounting structure comprising:
        a top horizontally-oriented frame element;
        a bottom horizontally-oriented frame element;
        a vertical frame element coupled to the top horizontally-oriented frame element and the bottom horizontally-oriented frame element, wherein the vertical frame element is located at a rear portion of the mounting structure; and
        an open front side of the mounting structure that is free of vertically-oriented frame elements on a left side and a right side of the mounting structure, wherein the open front side of the mounting structure is configured to accept installation of the computing or storage devices using one or more device chassis that engage with rails coupled to the top horizontally-oriented frame element or the bottom horizontally-oriented frame element.

2. The data center of claim 1, wherein the mounting structure further comprises:
    a plurality of vertically-oriented slots configured to accept the installation of a plurality of the one or more device chassis, wherein:
        an exterior vertical height of the mounting structure comprises a distance between a bottom portion of the bottom horizontally-oriented frame element and a top portion of the top horizontally-oriented frame element; and
        the vertically-oriented slots encompass a vertical interior height of the mounting structure extending from a top portion of the bottom horizontally-oriented frame element to a bottom portion of the top horizontally-oriented frame element.

3. The data center of claim 1, wherein the vertical frame element located in the rear portion of the mounting structure provides vertical structural support without vertical structural supports in a front or middle portion of the mounting structure.

4. The data center of claim 1, wherein the computing or storage devices of the at least one row mounted in the mounting structure extend along a cold aisle on a front side of the at least one row, and wherein a hot aisle extends along a back side of the at least one row.

5. The datacenter of claim 4, wherein at least two of the rows comprise respective instances of the mounting structure, wherein the mounting structures of the at least two rows are positioned on either side of the cold aisle, and wherein:
    the top horizontally-oriented frame elements of the respective mounting structures of the at least two rows extend, overhead, across the cold aisle;
    the respective mounting structures of the at least two rows each comprise an open front side facing the cold aisle; and
    the respective mounting structures of the at least two rows are configured to accept installation of the computing or storage devices via the respective open front sides facing the cold aisle.

6. A mounting structure, comprising:
    a top horizontally-oriented supporting element;
    a bottom horizontally-oriented supporting element;
    a vertical supporting element coupled to the top horizontally-oriented supporting element and the bottom horizontally-oriented supporting element, wherein the vertical supporting element is located at a rear portion of the mounting structure; and
    an open front side of the mounting structure that is free of vertically-oriented frame elements on a left side and a right side of the mounting structure, and that is configured to accept installation of computing or storage devices, wherein the computing or storage devices are installed in the mounting structure using one or more device chassis that engage with rails attached to the top horizontally-oriented supporting element or the bottom horizontally-oriented supporting element,
    wherein the vertical supporting element located in the rear portion of the mounting structure provides vertical structural support without vertical structural supports in a front portion of the mounting structure.

7. The mounting structure of claim 6, further comprising:
    a plurality of vertically-oriented slots, each configured to accept the installation of a device chassis.

8. The mounting structure of claim 6, wherein:
    the bottom horizontally-oriented supporting element is configured to mount on a floor of a facility in which the mounting structure is installed.

9. The mounting structure of claim 6, wherein:
a vertical exterior height of the mounting structure comprises a distance between a bottom portion of the bottom horizontally-oriented supporting element and a top portion of the top horizontally-oriented supporting element;
the vertically-oriented slots encompass a vertical interior height of the mounting structure extending from a top portion of the bottom horizontally-oriented supporting element to a bottom portion of the top horizontally-oriented supporting element; and
the rails are mounted to the top horizontally-oriented supporting element and the bottom horizontally-oriented supporting element, wherein the device chassis engages with the top horizontally-oriented supporting element and the bottom horizontally-oriented supporting element via the rails.

10. The mounting structure of claim 6, wherein the open front side of the mounting structure is configured to accept the installation of the computing or storage devices along a length of the open front side without supporting elements interspersed along the length of the open front side of the mounting structure.

11. A system, comprising:
a plurality of computing or storage devices;
a plurality of device chassis, wherein respective sets of the plurality of computing or storage devices are mounted in respective enclosures and wherein sets of the respective enclosure are mounted in respective ones of the device chassis; and
a mounting structure for the plurality of device chassis, the mounting structure comprising:
a top horizontally-oriented supporting element;
a bottom horizontally-oriented supporting element;
a vertical supporting element coupled to the top horizontally-oriented supporting element and the bottom horizontally-oriented supporting element, wherein the vertical supporting element is located at a rear portion of the mounting structure; and
an open front side of the mounting structure that is free of vertically-oriented frame elements on a left side and a right side of the mounting structure, and that is configured to accept installation of the plurality of device chassis, wherein respective ones of the plurality of device chassis engage with the top horizontally-oriented supporting element or the bottom horizontally-oriented supporting element via rails mounted to the top horizontally-oriented supporting element or the bottom horizontally-oriented supporting element,
wherein the vertical supporting element located in the rear portion of the mounting structure provides vertical structural support without vertical structural supports being included in a front portion of the mounting structure.

12. The system of claim 11, wherein the mounting structure further comprises:
a plurality of vertically-oriented slots configured to accept the installation of the plurality of device chassis, wherein:
a vertical exterior height of the mounting structure comprises a distance between a bottom portion of the bottom horizontally-oriented supporting element and a top portion of the top horizontally-oriented supporting element; and
the vertically-oriented slots encompass a vertical interior height of the mounting structure extending from a top portion of the bottom horizontally-oriented supporting element to a bottom portion of the top horizontally-oriented supporting element.

13. The system of claim 11, wherein respective ones of the computing devices mounted in the respective ones of the enclosures form respective computing servers.

14. The system of claim 11, wherein respective ones of the storage devices mounted in the respective ones of the enclosures form respective storage servers.

15. The system of claim 11, further comprising respective sets of casters mounted on bottom sides of the respective ones of the plurality of device chassis, wherein the casters engage with the bottom horizontally-oriented supporting element to support the respective ones of the plurality of device chassis.

16. The system of claim 11, wherein the plurality of device chassis are configured for hot-serviceability from at least two sides of respective ones of the device chassis.

17. The system of claim 16,
wherein mass storage devices mounted in respective sets of enclosures that are mounted in the respective ones of the device chassis are hot serviceable from a first side of the respective ones of the plurality of device chassis, and
wherein controller cards, for the mass storage devices, mounted in the enclosures mounted in the device chassis are hot-serviceable from a second side of the respective ones of the plurality of device chassis.

18. The system of claim 11, further comprising:
a power shelf mounted in a space:
below a top side of the bottom horizontally-oriented supporting element; or
above a bottom side of the top horizontally-oriented supporting element.

19. The system of claim 11, wherein the open front side has a height of 5 feet or more.

20. The system of claim 11, wherein the open front side of the mounting structure is configured to accept the installation of the device chassis along a length of the open front side without supporting elements interspersed along the length of the open front side of the mounting structure.

* * * * *